United States Patent [19]

Barry et al.

[11] Patent Number: 4,659,427

[45] Date of Patent: Apr. 21, 1987

[54] VIA FORMATION FOR MULTILAYERED METALIZATION

[75] Inventors: Vincent J. Barry, Tempe; Brenda A. Boucher-Puputti, Mesa; Thomas W. Fitzgerald, Scottsdale; Edward J. Bawolek, Chandler, all of Ariz.

[73] Assignee: GTE Laboratories Incorporated, Waltham, Mass.

[21] Appl. No.: 687,694

[22] Filed: Dec. 31, 1984

[51] Int. Cl.$^4$ .................... B44C 1/22; C23F 1/02; C03C 15/00; B29C 37/00

[52] U.S. Cl. .................... 156/643; 156/644; 156/646; 156/652; 156/655; 156/659.1; 156/667; 156/668; 204/192.32; 357/71; 427/90

[58] Field of Search ............ 204/164, 192 EC, 192 E; 156/626, 643, 644, 646, 650, 652, 655, 656, 659.1, 661.1, 662, 667, 668; 252/79.1; 427/38, 39, 88–90; 357/71; 29/578, 591

[56] References Cited

U.S. PATENT DOCUMENTS 3,900,944  8/1975  Fuller et al. .................... 156/656 X
4,184,909  1/1980  Chang et al. .................... 156/656 X

FOREIGN PATENT DOCUMENTS 52-39385  3/1977  Japan .................... 156/656

Primary Examiner—William A. Powell
Attorney, Agent, or Firm—John A. Odozynski

[57] ABSTRACT

A process for enhanced formation of vias in multilevel conductive structures for integrated circuit devices. A semiconductor wafer, bearing a multilayered first level metalization characterized by a tungsten alloy top layer, is annealed in a suitable ambient so as to form a distinctly colored superficial film atop the first level metalization. The interlevel dielectric is then deposited and subsequently selectively dry etched until the film becomes discernible, the film itself serving as an etch stop so as to protect the top layer of the first level metalization. Exposed portions of the superficial film are then removed through a standard plasma etch step. Remaining areas of the film promote intimate binding between the first level metalization and the interlevel dielectric.

2 Claims, No Drawings

VIA FORMATION FOR MULTILAYERED METALIZATION

TECHNICAL FIELD

The invention relates to the fabrication of integrated circuits and, more particularly, to a method of forming vias to a multilayered metalization level that includes a top layer comprising a tungsten alloy.

BACKGROUND OF THE INVENTION

Heretofore interconnection between the various components of VLSI circuits has been implemented using either metal, metal silicide, polysilicon or a combination of these as a conductor. Metal, either in a pure form or as an alloy, is the most commonly used conductor in VLSI technology. Aluminum and aluminum alloys, because of a number of eminently desirable properties, are foremost among the materials used in integrated circuit metalization. Salient among the characteristics that render aluminum desirable are its ease of deposition, low contact resistance, high conductivity, good adherence and bondability. These physical characteristics are complemented by its availability and moderate cost as compared to arguably competing materials.

However, certain aluminum silicon interactions detract from aluminum's general desirability, especially in VLSI applications. A thorough explication of such phenomena is provided in an article by Pramanik and Saxena titled "VLSI Metalization Using Aluminum and its Alloys," appearing in the January and March, 1983 issues of Solid State Technology. In particular, aluminum metalization is typified by electromigration, hillock formation and dissolution of silicon into aluminum. These effects are exacerbated in the presence of the narrow dimensions and very shallow junctions encountered in VLSI processes. Furthermore, the high surface reflectivity presented by aluminum tends to result in poor line definition when aluminum conductors are patterned according to standard optical lithographic techniques.

The use of polysilicon in an attempt to circumvent these difficulties is less than entirely successful because polysilicon is a comparatively poor conductor even when doped with selected impurities. Also, with regard to the fabrication of CMOS devices, two separate masking layers are needed to selectively dope the disparate N and P channel structures. Additional masking layers are undesirable because they can be expected to limit process throughput. The modest conductivity of the doped polysilicon can be enhanced by depositing an appropriate capping metal, but this interconnect scheme is also plagued with higher than desired contact resistance.

Another approach is to use a metal silicide as the interconnect material. The silicide provides a somewhat improved conductivity, although significantly inferior to that of a pure metal. The reduced conductivity, as with the polysilicon system, could be improved by adding a capping metal layer. The concept of dual layers of metal and silicide has been proposed as an effective compromise, but other disadvantages attend. To wit: high contact resistance, stress, and process inconsistency render this approach undesirable.

What is desired, therefore, is an interconnect material of requisite conductivity that provides an effective barrier to diffusion, low contact resistance, and suppression of hillock formation and electromigration. The concept of dual layers of metal and silicide has been proposed as an effective compromise to the above concerns. However, this approach requires precise control of the silicide formation to avoid local excesses of either the metal or the silicon. Such excesses can result in high stress or high resistance, respectively.

DISCLOSURE OF THE INVENTION

The above mentioned and other objects, advantages and capabilities are achieved in the invention by an interconnect for integrated circuit devices. The interconnect comprises a trilayer metal system with aluminum or aluminum alloy sandwiched between layers of a tungsten alloy refractory metal. In this metal scheme the aluminum is approximately one-half to one micron in thickness, whereas both refractory metal layers are approximately several thousand angstroms in thickness. This three layer structure is intended for the first level metal interconnect of multilevel metal interconnect systems.

In another aspect of the invention, an enhanced method for providing vias to the multilayered metalization is disclosed. The semiconductor wafer, including the deposited multilayered metalization, is heated in a suitable ambient to a temperature of approximately 400° centigrade for a period of time, approximately five minutes, sufficient to establish a distinctly colored superficial film atop the tungsten alloy layer. The interlevel dielectric is then laid atop the superficial layer and subsequently selectively etched away to the point at which the superficial layer becomes discernible. The exposed portions of the superficial layer are then removed in a plasma etch step.

DESCRIPTION OF A PREFERRED EMBODIMENT OF THE INVENTION

For a complete understanding of the invention, reference is made to the following description and appended claims.

As alluded to above, the subject invention is directed to a composite interconnect level that is deposited contiguously onto highly doped single crystal silicon or other contact areas on a VLSI device. The interconnect level is laid concomitant processes occurring immediately subsequent the opening of contacts to highly conductive single crystal silicon or to other conductive material. The trilayer metal scheme consists of aluminum or an aluminum alloy sandwiched between layers of tungsten alloy. The metal is deposited in situ using a multi-target sputter deposition system. Several thousand Angstroms of a tungsten alloy containing approximately a few percent by weight of titanium is deposited on the wafer by a sputter deposition technique. Subsequent to this deposition and without removal of the wafer from the deposition system, a layer of aluminum or aluminum alloy is deposited by a similar sputter deposition technique. This aluminum layer, which is approximately five thousand to ten thousand Angstroms thick, is then clad with a layer of tungsten alloy. The second tungsten layer is deposited in a manner largely identical to the deposition of the first and results in substantially the same composition and approximate thickness. The aluminum, if used as an alloy, may contain silicon at approximately one percent by weight and/or copper at four or less percent by weight. Additional amounts of copper tend to further retard hillock formation. However, elevated concentrations of copper are presently found to require inordinate thicknesses of photoresist during lithography. Should these constraints be obviated through advances in, for example, photoresist technology, concentrations of copper beyond four percent are expected to become practicable.

At this point the trilayer metal interconnect level is patterned to form the desired interconnects using conventional photolithographic techniques. A reactive ion etching technique is used to etch and define the composite metal level. The entire structure is etched in situ according to a multistep process using a combination of laser, emission and visual end point detection. Included in the etch process is a low power $CF_4$ passivation step used to eliminate corrosion of the aluminum or aluminum alloy layer.

Prior to the initiation of subsequent processing steps, the wafer is heated in a substantially inert ambient comprising traces of nitrogen or argon. This annealing step, which occurs at about 400° C. for a duration of approximately five minutes, promotes intimate interface bonding among the three metal layers and between the bottom tungsten alloy layer and the underlying contact regions. Intimate interface bonding is necessary in order to assure low resistance contacts.

The annealing step has been discovered to offer a significant process enhancement totally apart from the bonding aspects disclosed above. The brief anneal causes a thin discoloring layer, believed to be a nitride or an oxide, on the surface of the top tungsten alloy layer. The layer initially thought to be undesirable, has been found to significantly enhance subsequent processing steps related to the implementation of vias through the interlevel dielectric that separates the first and second levels of metalization. As is well know, vias are formed by laying an interlevel dielectric, such as polyimide or PSG, or a composite of the two, atop the first level metalization. Vias are then selectively provided over and through to selected areas of the first level metalization at positions where interconnection between the first and second levels of metalization are desired. The vias are formed by dry etching the interlevel dielectric until the top layer of the first level metal is exposed. It is of great importance that the entire depth of dielectric be removed but that none or minimal amounts of the metalization be affected. The extent of dielectric etch is typically determined by visual inspection. Because of the inherent difficulty heretofore encountered in discriminating between the dielectric and the metalization, the via etch process was prone to error. However, wafers fabricated according to the process described above will bear a thin discolored layer between the surface of the first level metal and the dielectric. The point at which dry etch of the dielectric, typically performed in $CF_4$ and oxygen, has reached the discolored layer will therefore become readily apparent. Further, the discolored layer itself serves as an etch barrier, so that likelihood of etching the metalization is additionally reduced. After the vias have been etched away as desired, the surface layer is removed in a plasma etch with, for example $CHF_3/0_2$. Areas of the surface layer that remain have been found to promote intimate contact at the interface of the top layer of the first level metalization and the interlevel dielectric.

The metal interconnect structure described above offers significant enhancements heretofore unattainable. The nearly ultimate interconnect properties are arrived at through selective exploitation and repression of each layer's respective advantages and disadvantages. Each of the metal layers has a specific function described in detail below.

Tungsten alloy was chosen because of its inherent ability to form ohmic contact to highly doped single and polycrystalline silicon surfaces through dielectric openings as small as one and one-half micron. The inclusion of metals such as titanium to form the alloy with tungsten promotes contact intimacy with the silicon because of the ability of such metals to overcome thin naturally forming surface oxides. This is a key to the successful implementation of this procedure.

Aluminum and aluminum alloys offer the necessary high conductivity and, as do the tungsten alloys, form excellent ohmic contacts. However, a major disadvantage attendant the use of aluminum as an interconnect in shallow junction devices results from the tendency of aluminum migration to cause shorting of those junctions. Tungsten alloy is not prone to this phenomenon and, in limited thicknesses, only slightly increases the overall resistance. In addition, up to temperatures approaching 500° C., tungsten alloy represents a natural diffusion barrier to metals such as aluminum. This allows materials such as LTO and polyimide, which require process temperatures in excess of 400° C., to be used as an interlevel dielectric without affecting the silicon metal integrity.

The approach also results in contact resistances between the interconnect layer and the single crystal regions at a low level not readily achievable by the best known competing approach, a dual layer comprising silicide in place of the refractory metal alloy. The simplicity attendant the formation of a multilayered conductor entirely from three sequential in situ depositions, absent the need for silicide formation, is considered significant.

The aluminum or aluminum alloy intermediate layer imparts to the composite a low sheet resistance, typically less than fifty milliohms per square. No other known conducting layer, using standard integrated circuit fabrication materials and normal film thickness, is deemed capable of providing a conductor of such low resistivity in a cost effective manner. Aluminum and other metal alloys provide sheet resistance values in the order of tens of milliohms per square. The refractory metals and their silicides provide sheet resistance values of the order of hundreds of milliohms per square. Doped polysilicon provides films thousands of milliohms per square and higher. Other detriments attributed to the refractory metal silicides and to doped polysilicon derive from the elevated temperatures at which these materials are processed. Specifically, such temperatures would further drive, that is, deepen, the shallow 0.2 to 0.3 micron junction depths encountered in state-of-art devices.

Although a two layer metal system consisting of a tungsten alloy capped with aluminum would meet the warranted low contact resistance values and high conductivity necessary for VLSI metallurgy, several faults would remain. Disadvantages associated with the dual metal scheme include electromigration, hillock formation and the imposition of unconventional photolithographic processing techniques. These disadvantages are circumvented by the trilayer scheme herein disclosed.

This additional tungsten alloy layer forms a structure that mitigates the aluminum hillock formation. In addition, the capping layer acts as a anti-reflective film, thereby allowing the use of conventional optical lithographic techniques. Without the additional layer, standard lithographic processing would be rendered impossible by the extremely high degree of light scattered in when defining aluminum and aluminum alloy conductors over the highly packed, varying height geometries found in VLSI designs. Known approaches for reducing reflectivity, such as ARC polymer coatings, add to process complexity and detract from beneficial features the tungsten alloy provides. Another advantage to the capping tungsten alloy layer is the improved first to second metal contact resistance.

The ease of processing is realized in the manufacture of 1.2 micron design technology. Following contact definition through the dielectric down to silicon and polysilicon, all three metal layers are deposited in a single pumpdown using a multitarget system. Line widths in the sub-micron area have been achieved without incorporating antireflective coatings. Dry etching of the three metal layers is accomplished sequentially in a single system. The protective resist layer can also be removed prior to removal of the device from the system. Curing of the polyimide interlevel dielectric at temperatures up to 500° C. engenders no silicon metal interfacial problems and assists in the inter metal layer integrity. Following via etch, which exposes the tungsten alloy, a second layer metal consisting of aluminum or aluminum alloy is deposited. This interfacial structure has low resistance and forms a reliable interconnect.

Accordingly, while there has been shown and described at present are considered to be the preferred embodiments of the invention it will be obvious to those having ordinary skill in the art of integrated circuit fabrication, that various changes and modifications may be made therein without departure from the scope of the invention as defined by the appended claims.

What is claimed is:

1. A method for enhanced formation of vias in an integrated circuit device that includes a multilayer metalization level characterized by a top layer comprising a tungsten alloy, the method comprising the steps of:
   (a) heating the device to a temperature of approximately 400° C. in a substantially inert ambient containing traces of oxygen or nitrogen for a period of time sufficient to develop a thin, superficial, distinctly colored film atop the tungsten alloy layer,
   (b) laying an interlevel dielectric layer atop the superficial layer,
   (c) etching away predetermined portions of the interlevel dielectric to a depth sufficient to expose the colored superficial layer, and
   (d) etching away the exposed portions of the superficial layer in a plasma etch.

2. A method as defined in claim 1 wherein the superficial layer is etched in $CHF_3$ and $O_2$.

* * * * *